United States Patent
Vecino Vazquez et al.

(10) Patent No.: US 11,652,137 B2
(45) Date of Patent: May 16, 2023

(54) SEMICONDUCTOR DEVICE WITH DRAIN STRUCTURE AND METAL DRAIN ELECTRODE

(71) Applicant: Infineon Technologies Austria AG, Villach (AT)

(72) Inventors: Enrique Vecino Vazquez, Munich (DE); Franz Hirler, Isen (DE); Manfred Pippan, Noetsch (AT); Daniel Pobig, Unterhaching (DE); Patrick Schindler, Munich (DE)

(73) Assignee: Infineon Technologies Austria AG, Villach (AT)

( * ) Notice: Subject to any disclaimer, the term of this patent is extended or adjusted under 35 U.S.C. 154(b) by 34 days.

(21) Appl. No.: 16/998,152

(22) Filed: Aug. 20, 2020

(65) Prior Publication Data
US 2020/0381511 A1    Dec. 3, 2020

Related U.S. Application Data

(60) Continuation of application No. 16/134,473, filed on Sep. 18, 2018, now Pat. No. 10,784,339, which is a
(Continued)

(30) Foreign Application Priority Data

Aug. 3, 2016 (DE) .......................... 102016114389.8

(51) Int. Cl.
*H01L 29/06* (2006.01)
*H01L 29/78* (2006.01)
(Continued)

(52) U.S. Cl.
CPC ...... *H01L 29/0634* (2013.01); *H01L 29/0696* (2013.01); *H01L 29/1095* (2013.01);
(Continued)

(58) Field of Classification Search
CPC ............. H01L 29/0634; H01L 29/0696; H01L 29/1095; H01L 29/41741; H01L 29/45;
(Continued)

(56) References Cited

U.S. PATENT DOCUMENTS 5,670,392 A * 9/1997 Ferla ................... H01L 29/1095
257/E29.066
8,901,717 B2   12/2014 Weber et al.
(Continued)

FOREIGN PATENT DOCUMENTS

CN          103378142 A      10/2013
CN          105552115 A       5/2016
(Continued)

*Primary Examiner* — Ajay Arora
(74) *Attorney, Agent, or Firm* — Murphy, Bilak & Homiller, PLLC

(57) ABSTRACT

A semiconductor device includes transistor cells formed along a first surface at a front side of a semiconductor body and having body regions of a first conductivity type, a drift region of a second conductivity type that is opposite from the first conductivity type and is disposed between the body regions and a second surface of the semiconductor body that is opposite from the first surface, and an emitter layer of the second conductivity type that is disposed between the drift region and a second surface of the semiconductor body, the emitter layer having a higher dopant concentration than the drift region, a metal drain electrode directly adjoining the emitter layer. The metal drain electrode comprises spikes extending into the emitter layer.

20 Claims, 17 Drawing Sheets

Related U.S. Application Data division of application No. 15/664,094, filed on Jul. 31, 2017, now Pat. No. 10,084,038.

(51) Int. Cl.

| | | |
|---|---|---|
| *H01L 29/66* | (2006.01) | |
| *H01L 29/10* | (2006.01) | |
| *H01L 29/417* | (2006.01) | |
| *H01L 29/45* | (2006.01) | |
| *H01L 29/739* | (2006.01) | |

(52) U.S. Cl.
CPC ........ *H01L 29/41741* (2013.01); *H01L 29/45* (2013.01); *H01L 29/66333* (2013.01); *H01L 29/66712* (2013.01); *H01L 29/7395* (2013.01); *H01L 29/78* (2013.01); *H01L 29/7802* (2013.01)

(58) Field of Classification Search
CPC ......... H01L 29/66333; H01L 29/66712; H01L 29/7395; H01L 29/78; H01L 29/7802
USPC ........................................................ 257/302
See application file for complete search history.

(56) References Cited

U.S. PATENT DOCUMENTS

| | | | |
|---|---|---|---|
| 2007/0215938 A1* | 9/2007 | Yanagida | H01L 29/7398 257/E29.198 |
| 2012/0276701 A1 | 11/2012 | Yedinak et al. | |
| 2014/0231910 A1* | 8/2014 | Willmeroth | H01L 29/1095 257/339 |
| 2015/0287786 A1* | 10/2015 | Jeon | H01L 29/1095 257/139 |
| 2015/0380403 A1* | 12/2015 | Kotsar | H01L 21/02236 257/334 |
| 2016/0141364 A1* | 5/2016 | Muramatsu | H01L 29/7393 257/139 |
| 2016/0204192 A1 | 7/2016 | Abiko et al. | |
| 2017/0133465 A1* | 5/2017 | Mauder | H01L 21/3065 |

FOREIGN PATENT DOCUMENTS

| | | |
|---|---|---|
| CN | 105789308 A | 7/2016 |
| DE | 102014101937 A1 | 8/2014 |
| DE | 102014101951 A1 | 8/2014 |

\* cited by examiner

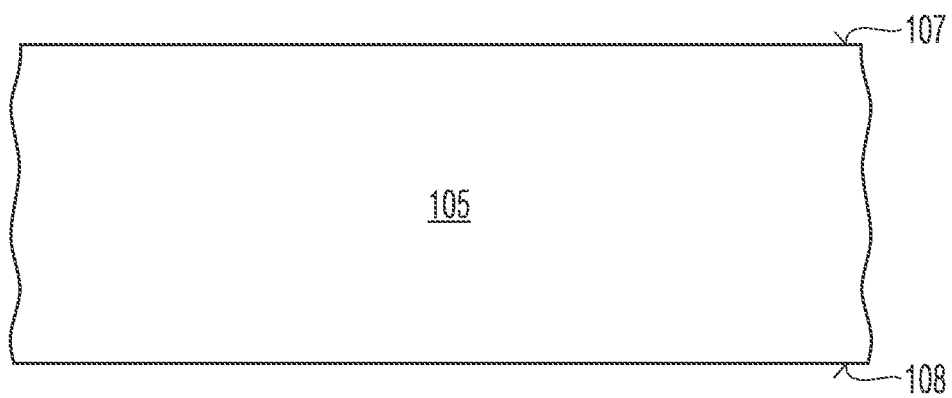
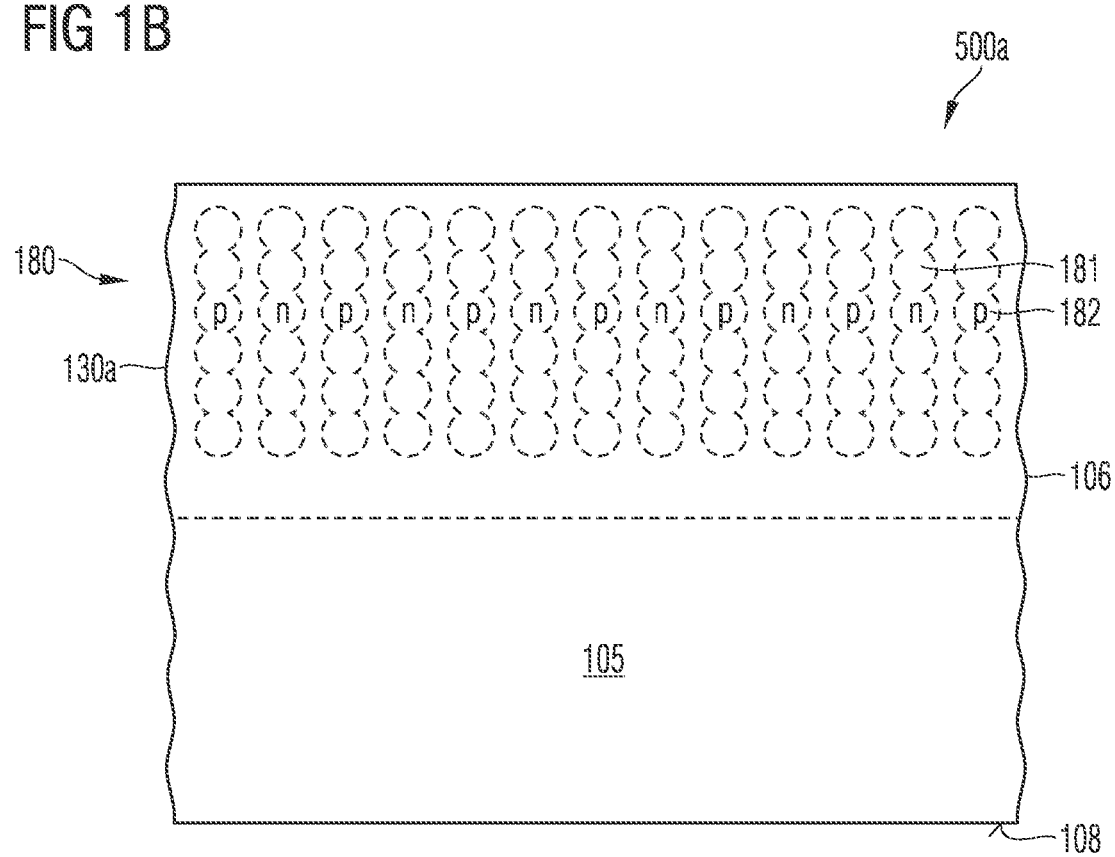

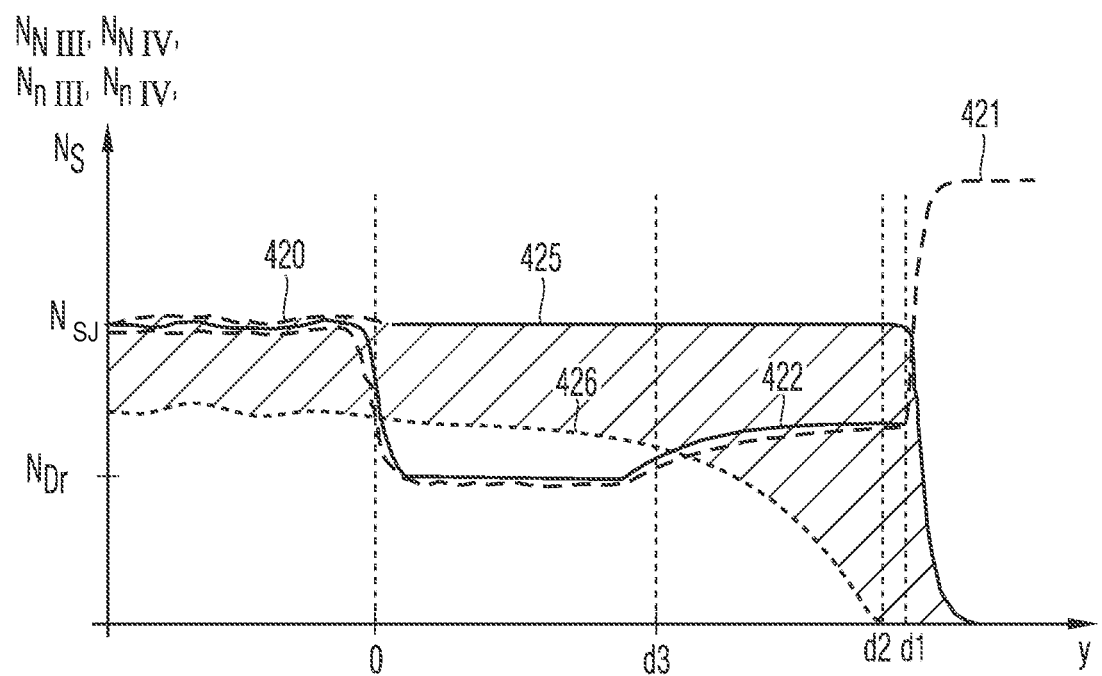

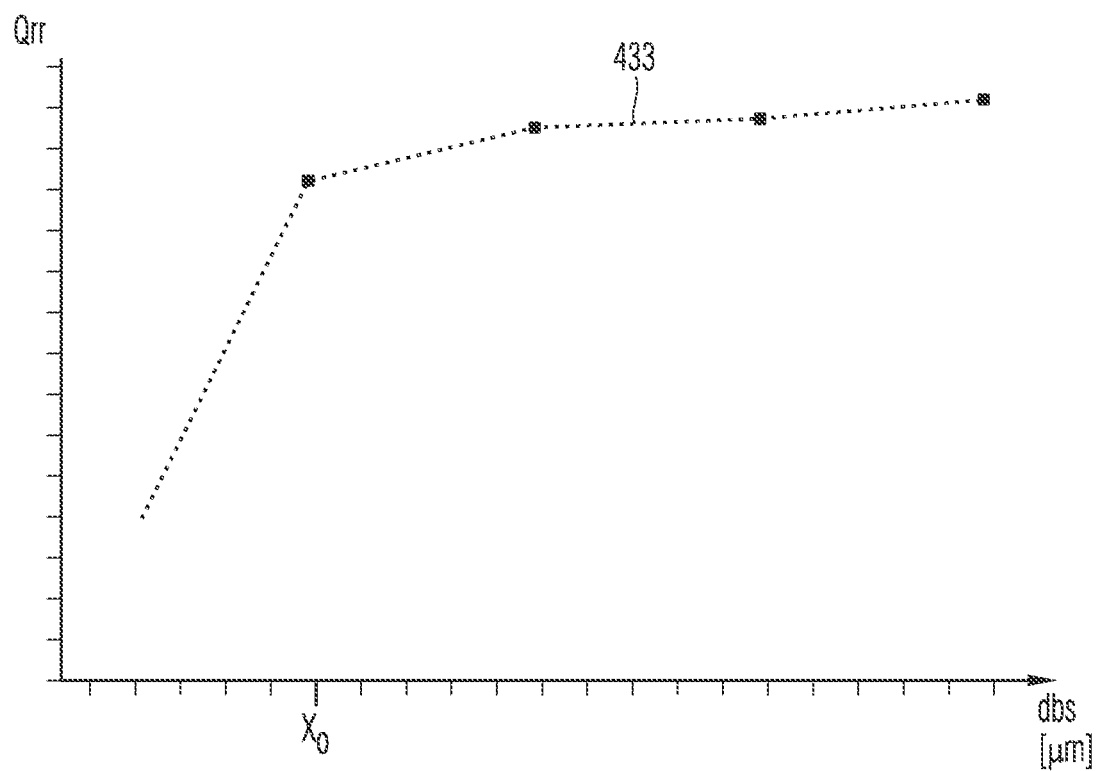

SEMICONDUCTOR DEVICE WITH DRAIN STRUCTURE AND METAL DRAIN ELECTRODE

RELATED APPLICATIONS

This application is a continuation of U.S. application Ser. No. 16/134,473 filed on 18 Sep. 2018, which in turn is a divisional of U.S. application Ser. No. 15/664,094 filed on 31 Jul. 2017, which in turn claims priority to German patent application 102016114389.8 filed on 3 Aug. 2016, the content of each document being incorporated by reference herein in its entirety.

BACKGROUND

Power semiconductor devices conduct a high load current and withstand a high blocking voltage. Superjunction devices include a superjunction structure with oppositely doped first and second regions formed in a drift zone which is electrically arranged in series to controllable MOSFET channels. When a blocking voltage is applied to the superjunction device, a lateral electric field rises and clears out the mobile charge carriers along the vertical pn junctions between the first and second regions. A space charge zones begins to expand perpendicularly to the direction of a load current flow in the on-state. The mobile charge carriers are completely forced out of the superjunction structure at a comparatively low blocking voltage. When the blocking voltage is further increased, the depleted superjunction structure acts as a quasi-intrinsic layer and the vertical electric field rises.

The breakdown voltage is decoupled from the dopant concentrations in the superjunction structure such that the dopant concentration in the superjunction structure can be comparatively high. Therefore superjunction devices typically combine very low on-state resistance with high blocking capability. The efficiency of the superjunction structure in terms of blocking capability and semiconductor volume is the better the better the dopant atoms in the oppositely doped regions of the superjunction structure are balanced and compensate each other.

It is desirable to improve superjunction semiconductor devices.

SUMMARY

According to an embodiment, a method of manufacturing semiconductor devices includes forming, by epitaxy, an epitaxial layer on a base substrate at a front side. From opposite to the front side, at least a portion of the base substrate is removed, wherein the base substrate is completely removed or a remnant base section has a thickness of at most 20 µm. Dopants of a first charge type are implanted from opposite of the front side into an implant layer of the epitaxial layer. A metal drain electrode is formed opposite to the front side and heats at least the implant layer to a temperature not higher than 500° C., wherein the heating activates only a portion of the implanted dopants in the implant layer and after heating an integrated concentration of activated dopants along a shortest line between the metal drain electrode and a closest doped region of a second, complementary charge type is at most $1.5E13\ cm^{-2}$.

According to another embodiment a semiconductor device includes transistor cells formed along a first surface at a front side of a semiconductor portion and further includes a drain structure between the transistor cells and a second surface of the semiconductor portion opposite to the first surface. The drain structure forms first pn junctions with body regions of the transistor cells and includes an emitter layer directly adjoining the second surface. A metal drain electrode directly adjoins the emitter layer. An integrated concentration of activated dopants along a shortest line between the metal drain electrode and a closest doped region of a charge type of the body regions is at most $1.5E13\ cm^{-2}$.

According to a further embodiment a semiconductor device includes transistor cells formed along a first surface at a front side of a semiconductor portion and further includes a drain structure between the transistor cells and a second surface of the semiconductor portion opposite to the first surface. The drain structure forms first pn junctions with body regions of the transistor cells and includes a uniformly doped remnant base section directly adjoining the second surface, wherein a vertical extension of the remnant base section is at most 20 µm. A metal drain electrode directly adjoins the remnant base section.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 1A is a schematic vertical cross-sectional view of a portion of a base substrate for illustrating a method of manufacturing a semiconductor device including a super junction structure according to an embodiment with a complete removal of a base substrate.

FIG. 1B is a schematic vertical cross-sectional view of a portion of a semiconductor substrate obtained by forming an epitaxial layer with a superjunction structure on the base substrate of FIG. 1A.

FIG. 4C is a schematic diagram for comparing vertical charge carrier distributions along line III-III of FIG. 4A and along line IV-IV in FIG. 4B for discussing effects of the embodiments.

FIG. 5B is a schematic diagram illustrating the reverse recovery charge as a function of a thickness of a semiconductor die for discussing effects of the embodiments.

FIG. 7A is a schematic vertical cross-sectional view of a power field effect transistor with super junction structure according to an embodiment concerning a completely removed base substrate and.

DETAILED DESCRIPTION

Figure 1C:
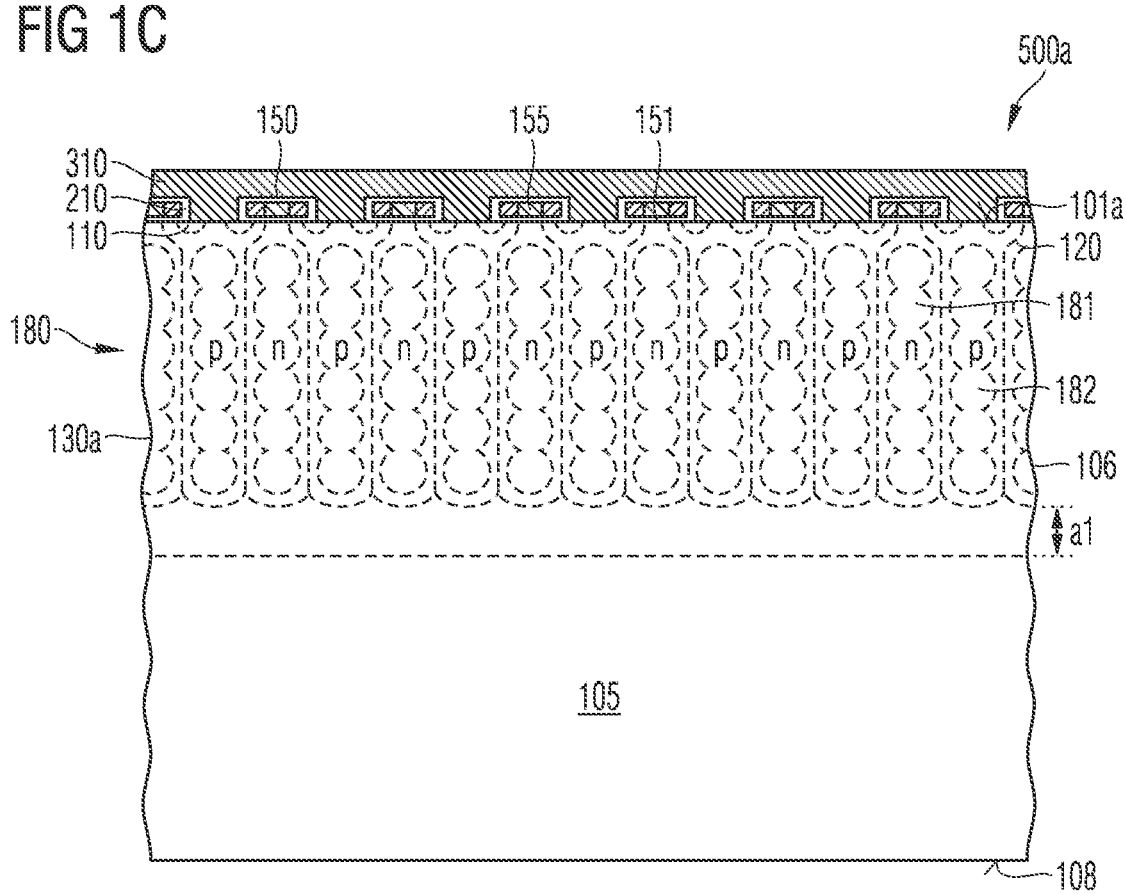
FIG. 1C is a schematic vertical cross-sectional view of the semiconductor substrate portion of FIG. 1B, after forming transistor cells at a front side.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example, a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a base substrate 105, which may be obtained from a semiconductor crystal, e.g., by sawing. The base substrate 105 may be comparatively heavily doped, wherein the dopant concentration in the base substrate 105 is approximately uniform.

The semiconductor material of the base substrate 105 may be silicon (Si), germanium (Ge), silicon germanium (Site) or an $A_{III}B_V$ semiconductor. For example, the base substrate 105 is a silicon wafer. A thickness of the base substrate 105 between a process surface 107 at a front side and a support surface 108 on the back may be in a range of several hundred μm, for example between 500 μm and 850 μm, e.g., about 725 μm for a silicon wafer with a diameter of 200 mm and about 775 μm for a silicon wafer with a diameter of 300 mm. Directions parallel to the exposed process surface 107 of the base substrate 105 are horizontal directions. A normal to the process surface 107 defines a vertical direction.

An epitaxial layer 106 with a superjunction structure 180 is formed on the process surface 107 at a front side of the base substrate 105. Formation of the superjunction structure 180 may be interleafed with the formation of the epitaxial layer 106, wherein in a multi-epi/multi-implant process formation of epitaxial sublayers alters with implants for the formation of oppositely doped superjunction regions. According to other embodiments, the superjunction structure 180 is formed by forming a thick epitaxial sublayer, forming trenches in the thick epitaxial sublayer and, e.g., implanting dopants through sidewalls of the trenches or depositing doped layers in the trenches.

FIG. 1B shows a superjunction structure 180 in an epitaxial layer 106 formed at the front side of the base substrate 105. The superjunction structure 180 includes first regions 181 of a first charge type corresponding to a first conductivity type and second regions 182 of a complementary second charge type corresponding to a second conductivity type. Planes of equal doping concentration may be approximately planar and vertical or may include several bulges along the vertical direction.

Transistor cells TC are formed at the front side of a semiconductor substrate 500*a* that includes the base substrate 105 and the epitaxial layer 106 with the superjunction structure 180. The transistor cells TC may be IGFET (insulated gate field effect transistor) cells electrically connected in parallel to each other. The transistor cells TC may have planar gates with gate electrodes formed above the main surface 101*a* of the semiconductor substrate 500*a* or may be trench gates extending from the main surface 101*a* into the semiconductor substrate 500*a*. Formation of the transistor cells TC may include formation of a further epitaxial sublayer above the superjunction structure 180.

FIG. 1C shows the transistor cells TC formed at the front side of the semiconductor substrate 500*a*. The illustrated embodiment refers to transistor cells TC, which are n-IGFETs with p-type body regions 120 that directly adjoin the p-type second regions 182 of the superjunction structure 180 and that separate n-type source regions 110 from n-type first regions 181 of the superjunction structure 180. Other embodiments refer to p-IGFET cells with complementary doping.

After formation of the transistor cells TC, for example after formation of a metal source electrode 310 electrically connected with the body regions 120 and with the source regions 110 of the transistor cells TC through openings in an interlayer dielectric 210 sandwiched between the main surface 101*a* and the metal source electrode 310, a substrate carrier 390 may be attached to the semiconductor substrate 500*a* at the front side.

A thinning process removes at least a portion of the base substrate 105. The thinning process may be a wafer splitting process along a porous portion of the base substrate 105 or a grinding process. The thinning process may remove the complete base substrate 105 and, if applicable, an exposed portion of the epitaxial layer 106 or may leave a remnant base section of the base substrate 105, wherein the remnant base section has a thickness of not more than 20 μm. In case the base substrate 105 is completely removed, any conductivity type can be chosen for the base substrate 105.

Figure 1D:
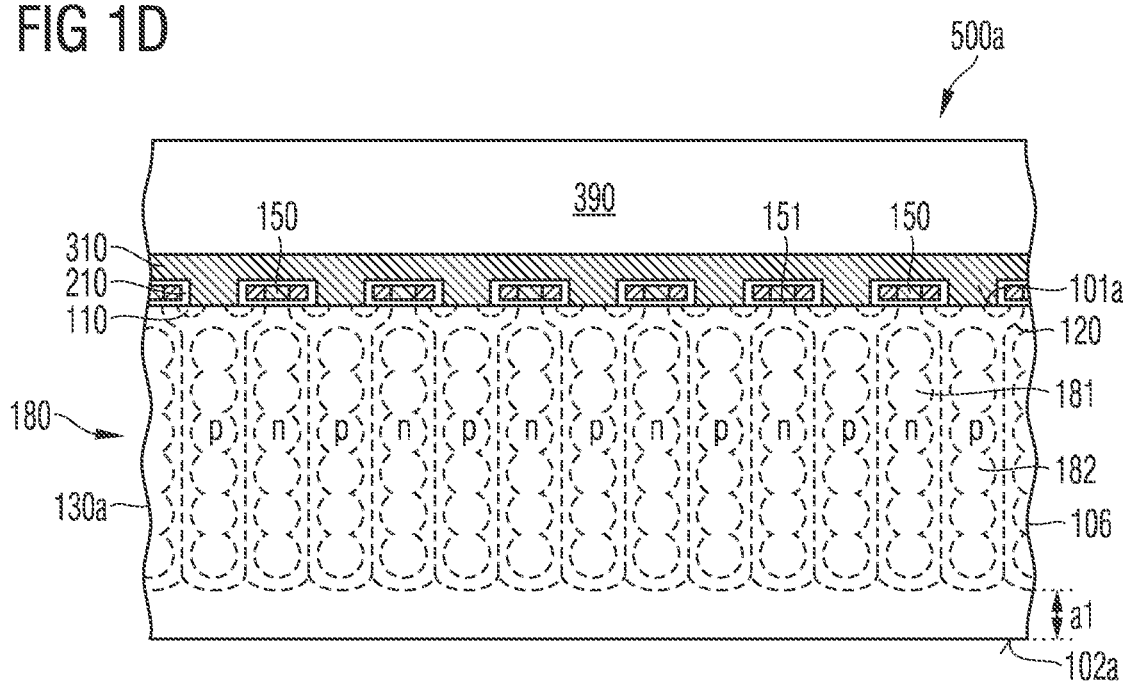
FIG. 1D is a schematic vertical cross-sectional view of the semiconductor substrate portion of FIG. 1C, after removing the base substrate.

FIG. 1D shows the semiconductor substrate 500*a* with the base substrate 105 of FIG. 1C completely removed and with an implant surface 102*a* of the epitaxial layer 106 exposed on the back opposite to the substrate carrier 390. A distance a1 between the implant surface 102*a* and the second region 182 of the superjunction structure 180 is at most 50 μm, e.g., at most 25 μm.

Dopants of the first charge type, e.g., donors in case of n-channel transistor cells TC, are implanted from the back through the implant surface 102*a* to form an implant layer 138 along the implant surface 102*a*. A metal or metallization stack is deposited on the implant surface 102*a* to form a metal drain electrode 320. A metallization stack of the metal drain electrode 320 may include a nickel silver (NiAg) layer for soft soldering or a gold tin (AuSn) layer for diffusion soldering. The metal drain electrode 320 may have a flat interface to the epitaxial layer 106 or may include protrusions extending into the epitaxial layer 106.

Figure 1E:
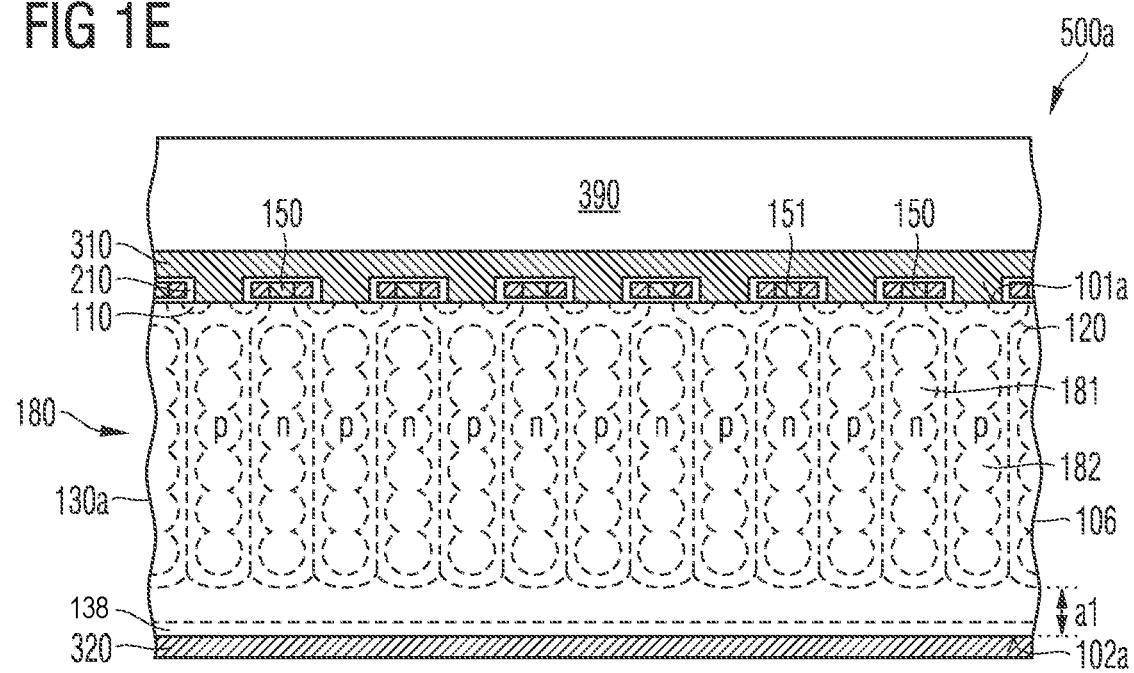
FIG. 1E is a schematic vertical cross-sectional view of the semiconductor substrate portion of FIG. 1D, after implanting dopants into the epitaxial layer and forming a metal drain electrode.

FIG. 1E shows the implant layer 138 formed along the implant surface 102*a*. A heating treatment may be applied, wherein a maximum temperature of the heating treatment is at most 500° C., e.g., at most 350° C. such that only a portion of the implanted dopants in the implant layer 138 gets activated. The heating treatment may be a dedicated heat treatment, e.g. in a furnace. According to other embodiments, a process for attaching a semiconductor die 500*b* obtained from the semiconductor substrate 500*a* of FIG. 1E by sawing includes a soldering process, for example, soft soldering or diffusion soldering, at temperatures of at most 350° C., wherein the soldering process anneals and activates only a portion of the implanted dopants.

Figure 1F:
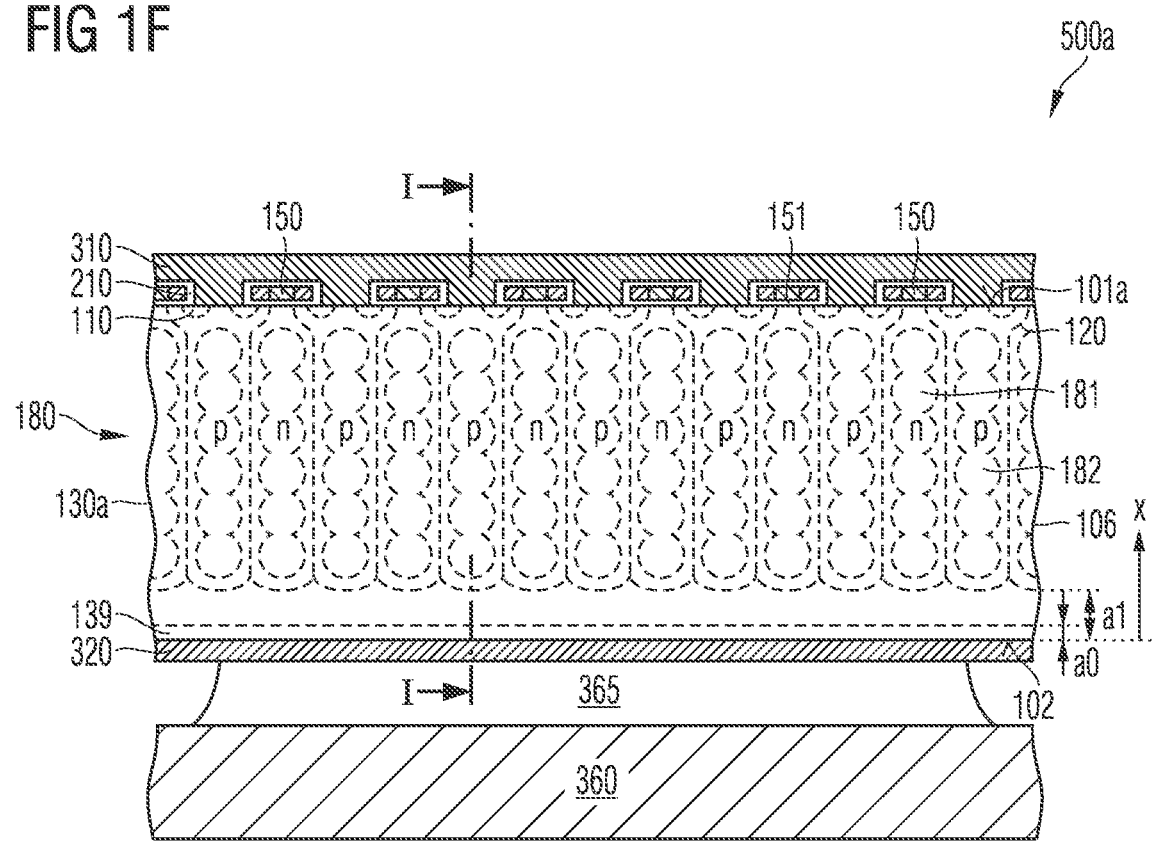
FIG. 1F is a schematic vertical cross-sectional view of the semiconductor substrate portion of FIG. 1E, after soldering a semiconductor die obtained from the semiconductor substrate of FIG. 1E on a die carrier.

FIG. 1F shows a semiconductor device 500 obtained by soldering a semiconductor die 500*b* obtained from the semiconductor substrate 500*a* of FIG. 1E by removing the substrate carrier 390 from the front side and sawing the semiconductor substrate 500*a* along separation traces.

A solder layer system 365 mechanically and electrically connects the metal drain electrode 320 with a die carrier 360 such as a copper plate. A dedicated heat treatment and/or the soldering process activates a portion of the implanted dopants and transforms the implanted layer 138 of FIG. 1E into an emitter layer, wherein an integrated activated donor concentration along a shortest line connecting the metal drain electrode 320 with the closest doped region of a conductivity type opposite to the conductivity type of the emitter layer 139 is not greater than 1.5E13 cm$^{-2}$, for example, not greater than 8E12 cm$^{-2}$.

In the presence of the superjunction structure 180, the closest doped regions of the conductivity type opposite to the conductivity type of the emitter layer 139 are the second regions 182 of the superjunction structure 180. In absence of a superjunction structure, the closest doped regions of the conductivity type opposite to the conductivity type of the emitter layer 139 may be the body regions 120 of the transistor cells TC.

The activated donors define a backside emitter layer 139 which is sufficiently strong to emit electrons in the on-state of the IGFET under forward bias and to allow tunneling of holes into the metal drain electrode 320 under reverse bias. Holes reaching the metal drain electrode 320 and recombining therein reduce the emitter efficiency at the backside such that the mean charge carrier plasma density in case of a forward conducting body diode is significantly reduced. Recombination of the holes in the metal drain electrode 320 pins a hole density to zero at the interface between backside emitter layer 139 and metal drain electrode 320. With the hole density pinned to zero at the semiconductor/metal interface between the emitter layer 139 and the metal drain electrode 320, a hole distribution steadily declines from the superjunction structure 180 towards the semiconductor/metal interface. As a result, the total reverse recovery charge Qrr is drastically reduced.

Figure 1G:
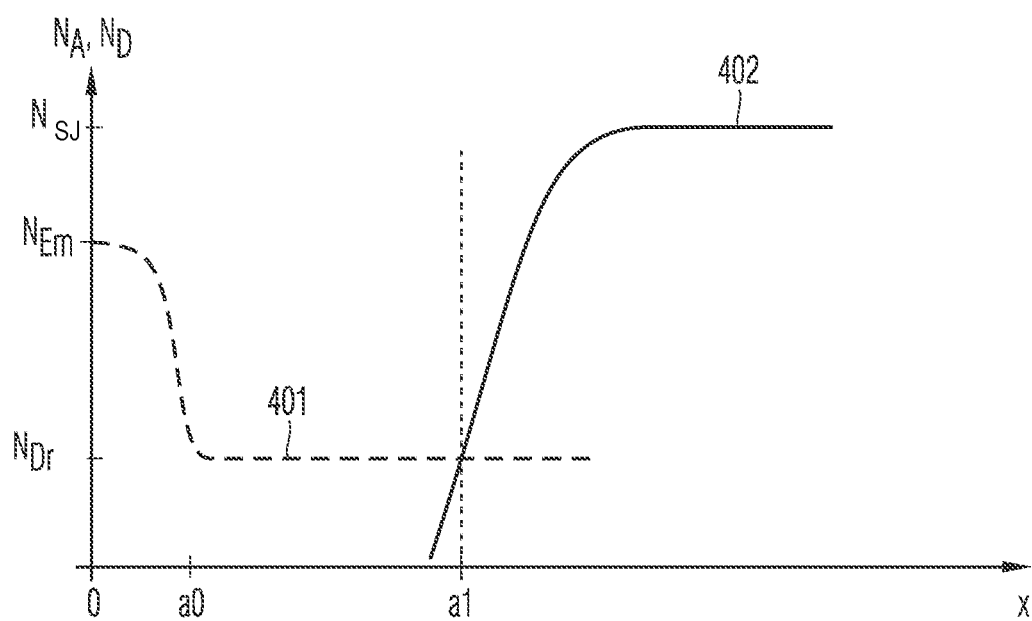
FIG. 1G is a schematic diagram showing a vertical dopant distribution along line I-I of FIG. 1F, after a heating treatment.

FIG. 1G shows a vertical donor distribution 401 and a vertical acceptor distribution 402 along line I-I of FIG. 1F, wherein the donor distribution 401 falls from a maximum donor density $N_E$ close the metal/semiconductor interface to a comparatively low drift zone donor density $N_{drift}$ within a distance corresponding to a vertical extension a0 of the emitter layer 139.

Figure 2A:
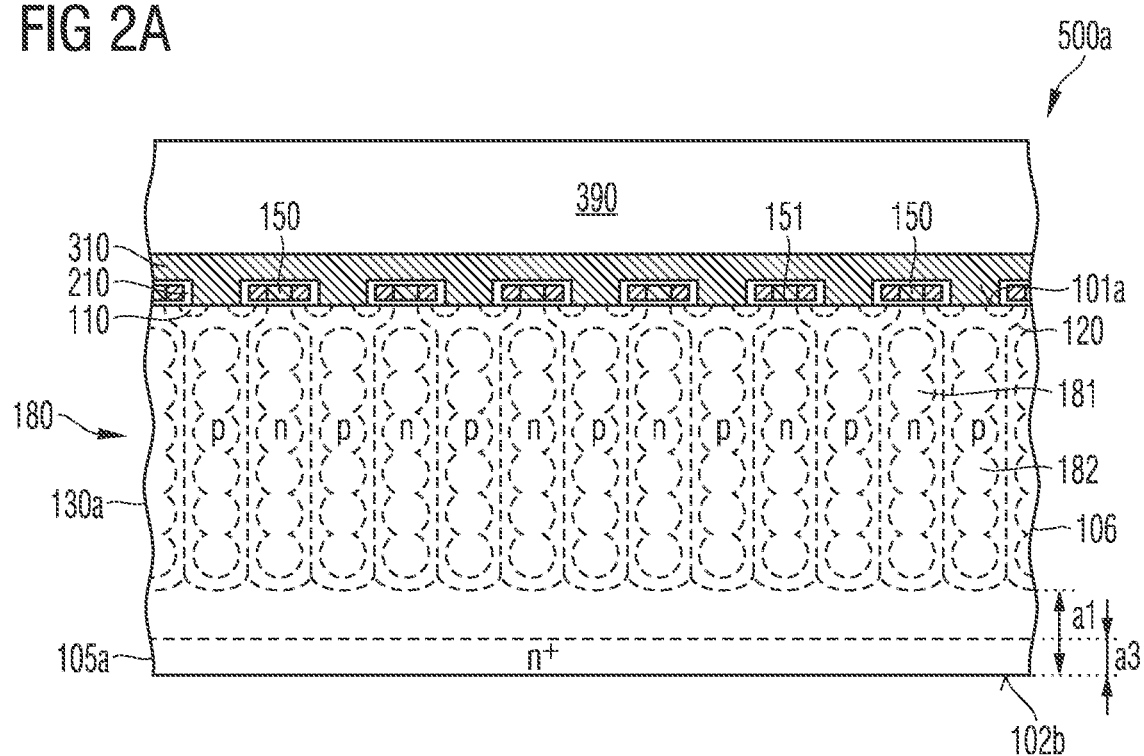
FIG. 2A is a schematic vertical cross-sectional view of a semiconductor substrate portion for illustrating a further method of manufacturing a semiconductor device including a super junction structure according to an embodiment with a partial removal of a base substrate, after removing a section of the base substrate of the semiconductor substrate portion of FIG. 1C.
Figure 2B:
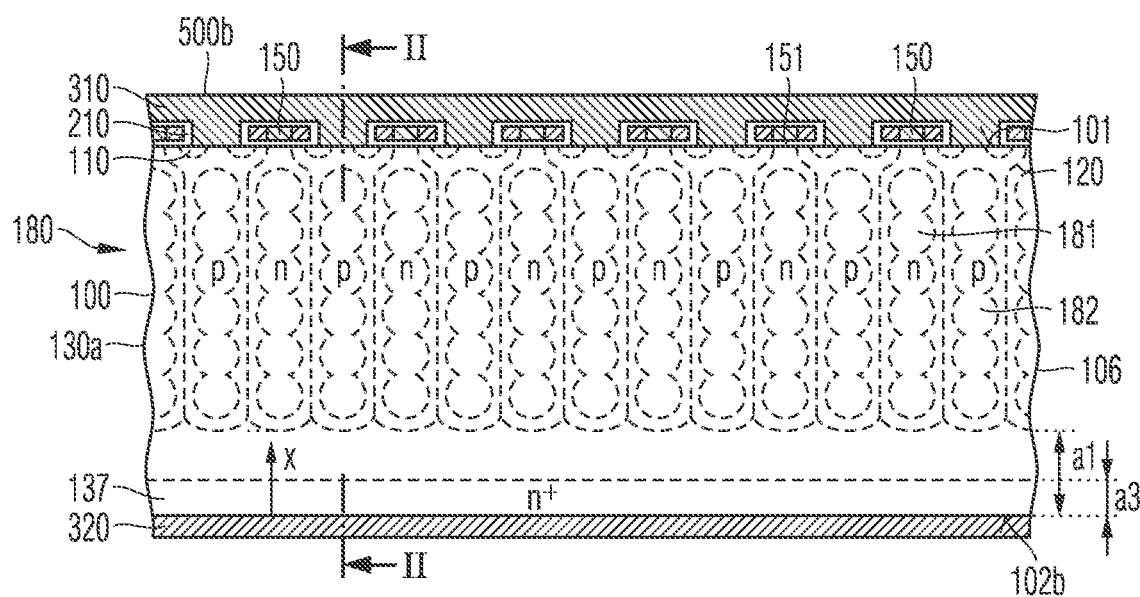
FIG. 2B is a schematic vertical cross-sectional view of the semiconductor substrate portion of FIG. 2A, after forming a metal drain electrode at the back side.
Figure 2C:
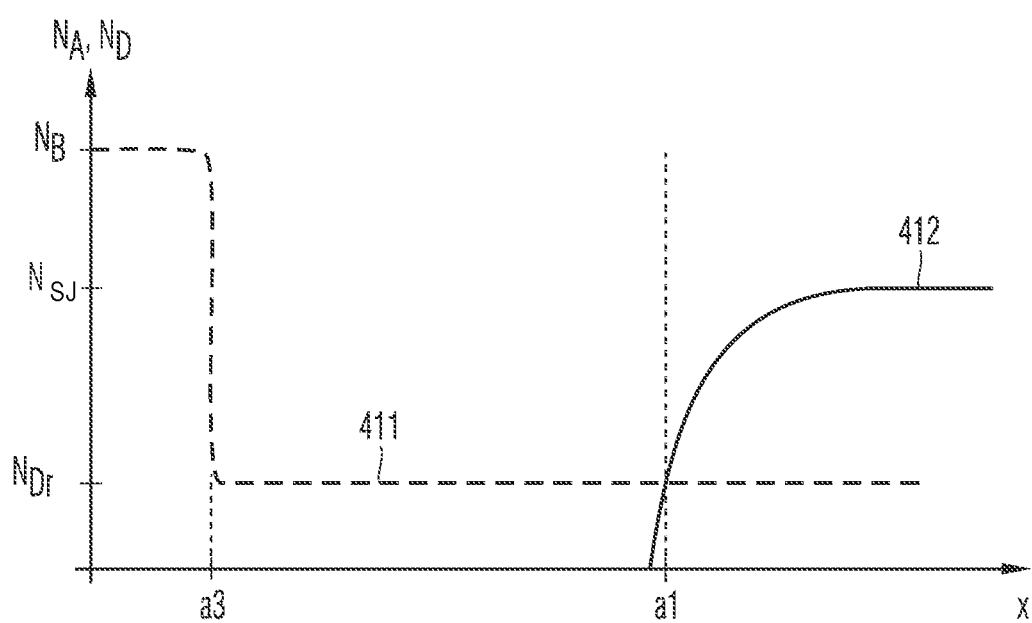
FIG. 2C is a schematic diagram showing a vertical dopant distribution along line II-II of FIG. 2B.

FIGS. 2A to 2C refer to an alternative embodiment to FIGS. 1C to 1F, wherein only a portion of the base substrate 105 of FIG. 1C is removed and a thin remnant base section 105a with a recessed surface 102b forms a section of the semiconductor portion of a semiconductor device.

According to FIG. 2A, a remaining thickness a3 of the thinned remnant base section 105a is at most 20 μm, for example, at most 10 μm, or at most 8 μm.

Dopants may be implanted through the remnant base section 105a into the epitaxial layer 106, a metal drain electrode 320 is formed on the recessed surface 102b and individual semiconductor dies 500b are obtained from the semiconductor substrate 500a as discussed with reference to FIGS. 1E and 1F.

FIG. 2B shows a semiconductor die 500b obtained by, e.g., sawing from the semiconductor substrate 500a of FIG. 2A. A semiconductor portion 100 includes a drain contact structure 137 obtained from the remnant base section 105a of FIG. 2A.

FIG. 2C shows a vertical donor distribution 411 and a vertical acceptor distribution 412 along line II-II of FIG. 2B, wherein the donor distribution 411 is approximately uniform with the drain contact structure 137. According to an embodiment, a field stop layer may be formed between the superjunction structure 180 and the drain contact structure 137.

Figure 3A:
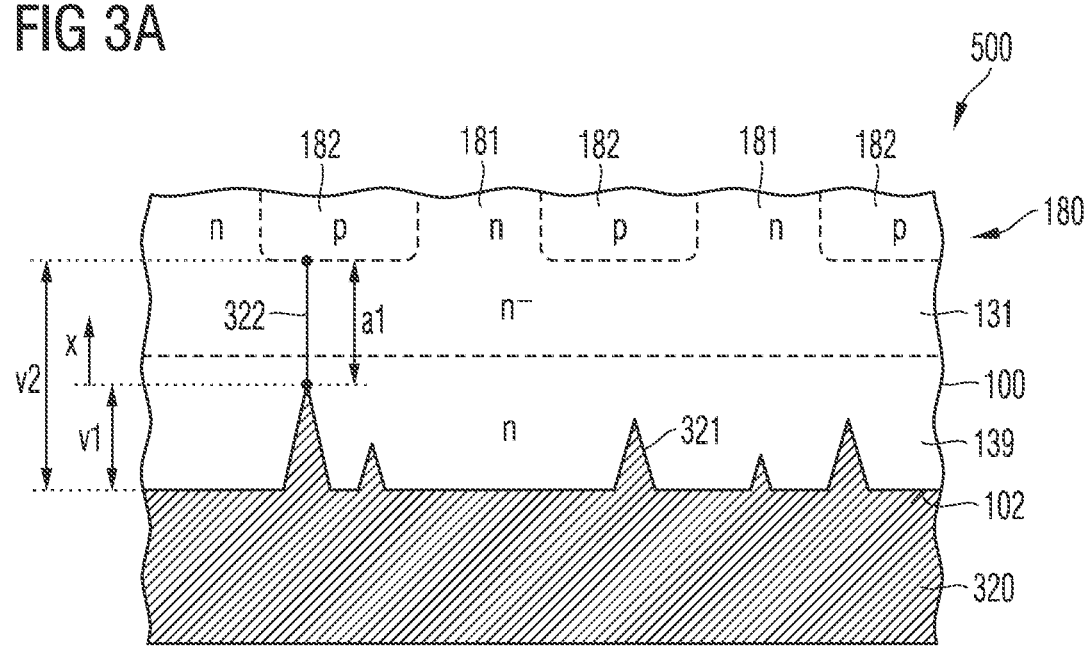
FIG. 3A is a schematic vertical cross-sectional view of a portion of a semiconductor device according to an embodiment referring to an implanted emitter layer and a metal drain electrode including spikes.
Figure 3B:
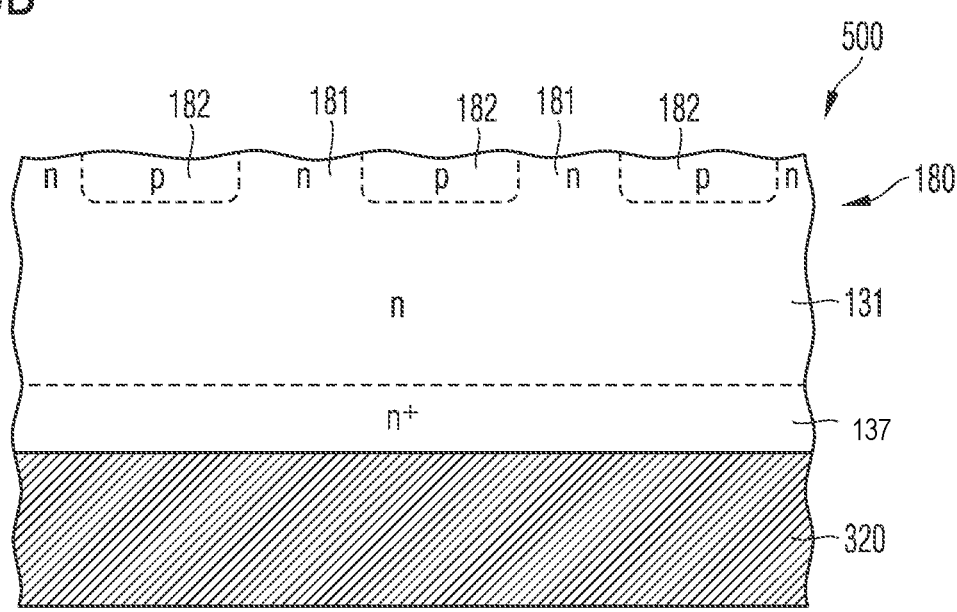
FIG. 3B is a schematic vertical cross-sectional view of a portion of a semiconductor device according to an embodiment with a remnant section of a base substrate and a metal drain electrode without spikes.

FIGS. 3A and 3B refer to details of the electric contact at a semiconductor/metal interface on the back of semiconductor devices 500.

In FIG. 3A a base substrate is completely removed and a backside emitter layer 139 is formed in a semiconductor portion 100 obtained from an epitaxial layer. The metal drain electrode 320 directly adjoins the semiconductor portion 100. The implant of dopants from the back and a heating treatment, e.g., in course of a soldering, generates a backside emitter layer 139. In the backside emitter layer 139 the dopant concentration is higher than in a section of a drift zone 131 directly adjoining the backside emitter layer 139 or, in the presence of a field stop layer, in a section of the field stop layer directly adjoining the emitter layer 139. The implant may partially amorphize a section of the semiconductor portion 100. The metal and the silicon form a eutectic solution, wherein the solubility of silicon in aluminum is comparatively high. Silicon atoms diffusing into the metal drain electrode 320 leave voids into which spikes 321 of metal or a metal alloy containing silicon grow.

FIG. 3A shows spikes 321 of different height extending from the second surface 102 into the backside emitter layer 139. A maximum vertical extension v1 of the spikes 321 may be greater than 1 μm, for example, about 4 μm.

An integrated activated donor concentration along a shortest line 322 connecting the metal drain electrode 320 with any of the second regions 182 of a superjunction structure 180 is not greater than $1.5E13\ cm^{-2}$, for example, not greater than $8E12\ cm^{-2}$.

Under reverse bias, a body diode formed by the drain structure 130 and the body regions connected to the second regions 182 of the superjunction structure is forward biased and a forward current flows through the semiconductor portion. A hole plasma that forms in the semiconductor portion 100 when the body diode is forward biased is pinned to zero at the top of the spikes 321. The holes reach the metal drain electrode 320 and recombine therein, thereby reducing electron emitter efficiency. Due to the reduced emission of electrons, the overall plasma density in the semiconductor portion 100 drastically decreases. On the other hand, the emitter layer 139 can be a sufficiently robust electron emitter as long as the integrated dopant concentration along the shortest line 322, i.e., along the narrowest path between the metal drain electrode 320 and a pn junction is less than $1E13\ cm^{-2}$.

FIG. 3B shows a metal drain electrode 320 directly adjoining a drain contact structure 137 formed from a remnant base section 105a of a base substrate as shown in FIG. 2A, wherein the drain contact structure 137 has a thickness of at most 20 μm, for example at most 5 μm. Within the drain contact structure 137 the hole concentration falls to zero. If the drain contact structure 137 is sufficiently thin, the hole density at the interface between the drift zone 131 and the drain contact structure 137 is lower than in a comparative example with a thick base substrate such that reverse recovery charge is drastically reduced even if the hole density at the interface between the drift zone 131 and the drain contact structure 137 is not equal 0.

Figure 4A:
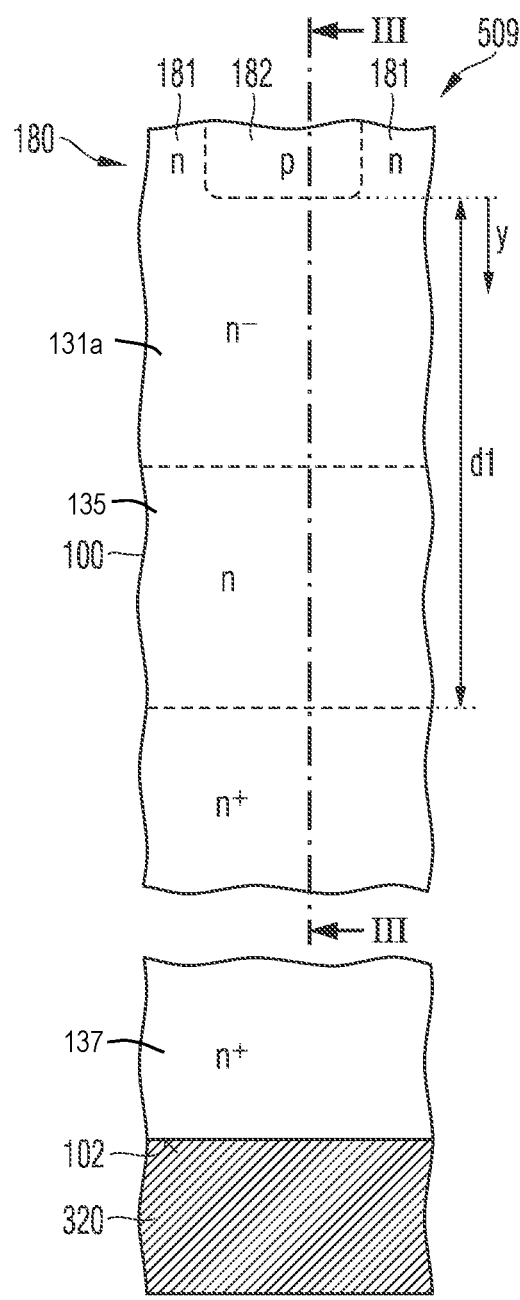
FIG. 4A is a schematic vertical cross-sectional view of a portion of a semiconductor device with a thick base substrate according to a reference example for discussing effects of the embodiments.
Figure 4B:
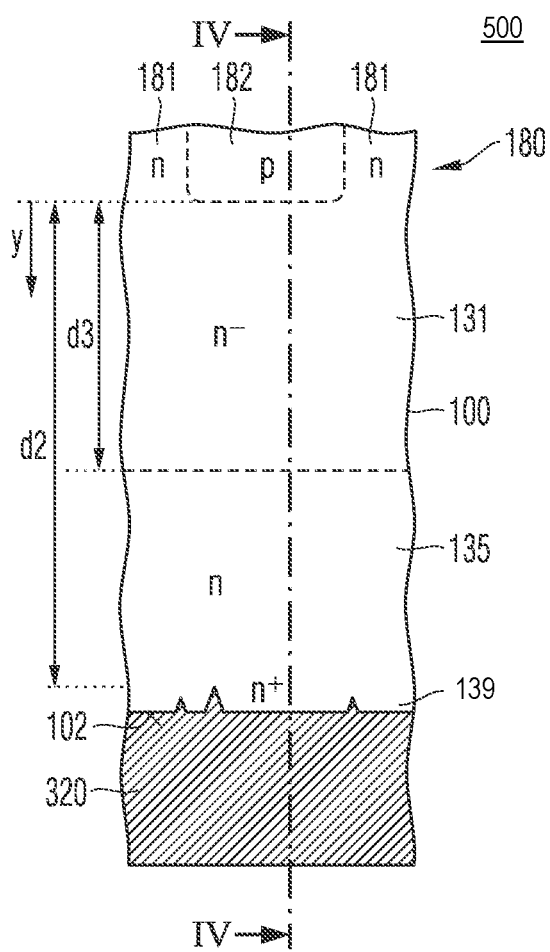
FIG. 4B is a schematic vertical cross-sectional view of a portion of a semiconductor device with an emitter layer and a field stop layer according to an embodiment.

FIGS. 4A to 4C compare the hole distribution in a conventional device with the hole distribution in a semiconductor device according to the embodiments.

FIG. 4A shows a portion of a comparative device 509 with a semiconductor portion 100 and a metal drain electrode 320 directly adjoining the semiconductor portion 100 at a second surface 102 on the back. The semiconductor portion 100 includes a heavily n-doped drain contact structure 137 formed from a substrate section which is thicker than 20 μm and an epitaxial section that includes inter alia a drift zone 131 and a field stop layer 135 sandwiched between the drift zone 131 and the drain contact structure 137. A lightly doped drift zone portion 131a may separate n-doped first regions 181 and p-type second regions 182 of a superjunction structure 180 from the field stop layer 135.

In FIG. 4C, a first vertical net dopant distribution 421 shows the net dopant concentration $N_{nIII}(y)$ as a function of a vertical distance d to the superjunction structure 180 for the comparative device 509. The net dopant distribution 421 includes a section of high doping in the drain contact structure 137.

In FIG. 4C, the hole distribution 425 shows the hole density $N_{hIII}(y)$ as a function of the vertical distance y to the superjunction structure 180. In case the body diode of the comparative device 509 is forward biased, the hole distribution 425 significantly drops only within the heavily doped drain contact structure 137 and has a comparatively high level in the superjunction structure 180 and between the superjunction structure 180 and the drain contact structure 137.

In the semiconductor device 500 of FIG. 4B, the base substrate is completely removed and the metal drain electrode 320 directly adjoins an emitter layer 139 formed by implant in a section of an epitaxial layer. The integrated dopant concentration along a shortest line 322 between the outermost spikes and the bottom of the p-type second regions 182 of the superjunction structure 180 is at most $1.5E13\ cm^{-2}$ as defined in equation (1).

$$\int_0^{d_2} N_D(y)\,dy \le 1.5E13\ cm^{-3} \qquad (1)$$

In FIG. 4C, a second vertical net dopant distribution 422 shows the net dopant concentration $N_{nIV}(y)$ as a function of a vertical distance y to the superjunction structure 180 for the semiconductor device 500 of FIG. 4B.

The corresponding hole distribution 426 shows the corresponding hole density $N_{hIV}(y)$ as a function of the vertical distance y to the superjunction structure 180. In case the body diode of the semiconductor device 500 of FIG. 4B is forward biased, the hole distribution 426 in the metal drain electrode 320 is equal to 0 and drops to zero within the epitaxial layer to equal 0.

The shaded area indicates the difference between the hole density in the conventional device 509 and the hole density in the semiconductor device 500 according to the embodiments and is a measure for the reduction of the hole plasma and the reverse recovery charge.

Figure 5A:
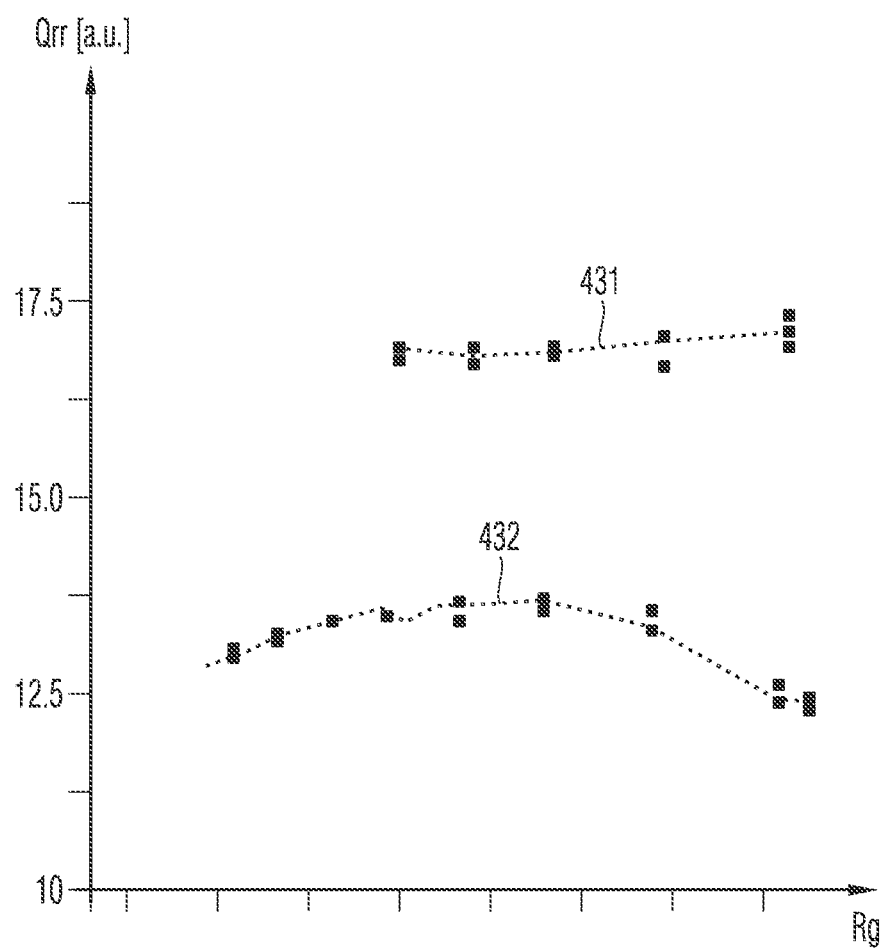
FIG. 5A is a schematic diagram for illustrating effects of the embodiments on the reverse recovery charge.

In FIG. 5A, a first distribution 431 shows measured values of the reverse recovery charge $Q_{rr}$ for a device with a thickness of the semiconductor die of 220 μm at different values for the gate resistance $R_g$. A second distribution 432 shows the equivalent distribution for comparative semiconductor devices with a total thickness of 90 μm, wherein the base substrate is thinned by 130 μm. The thinning leads to a reduction of the reverse recovery charge to about 30%. The reduction points to a significantly reduced charge carrier plasma density in a portion of the semiconductor die outside of the base substrate. The effect holds for a metal drain electrode including a gold tin layer (AuSn) and diffusion soldering die-attached process and a nickel silver (NiAg) metal drain electrode in combination with a soft solder die-attached process.

In FIG. 5B, line 433 plots the measured values for the reverse recovery charge $Q_{rr}$ for semiconductor devices which semiconductor portions deviate from each other in total thickness. The reverse recovery charge abruptly decreases shortly before the base substrate is completely removed at x=x0.

Figure 5C:
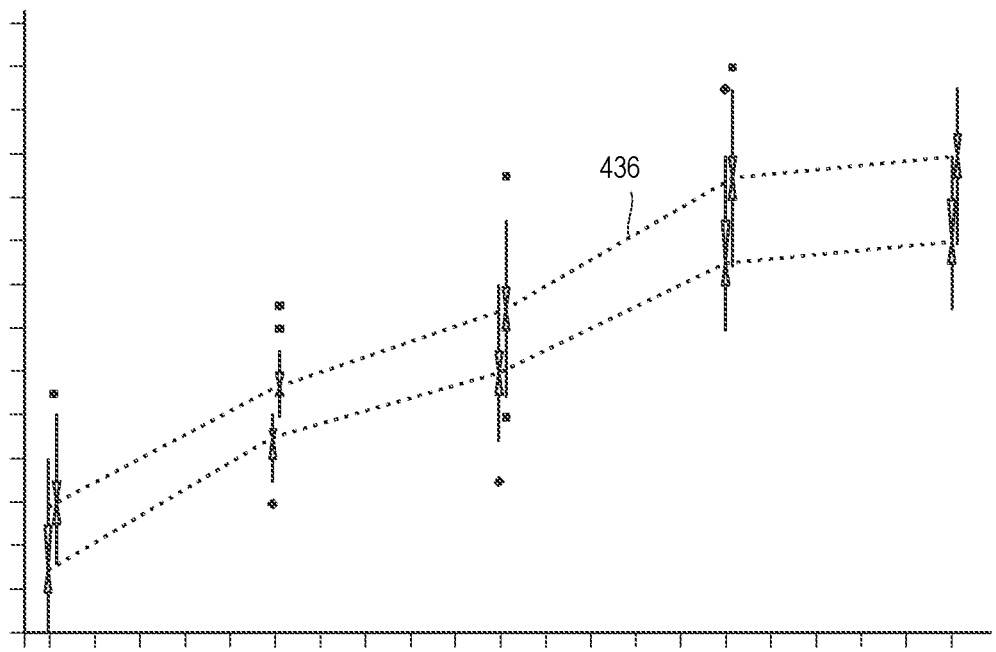
FIG. 5C is a schematic diagram illustrating the impact of the thickness of a base substrate on the on-state resistance for discussing effects of the embodiments.

In FIG. 5C, line 436 shows the on-state resistance $R_{dson}$ as a function of the thickness of the semiconductor die. Where a thinning the base substrate by 10 μm at a remaining thickness of more than 20 μm has only low impact on $R_{dson}$, removal of further portions of the base substrate reduces $R_{dson}$ by more than 5%.

Figure 5D:
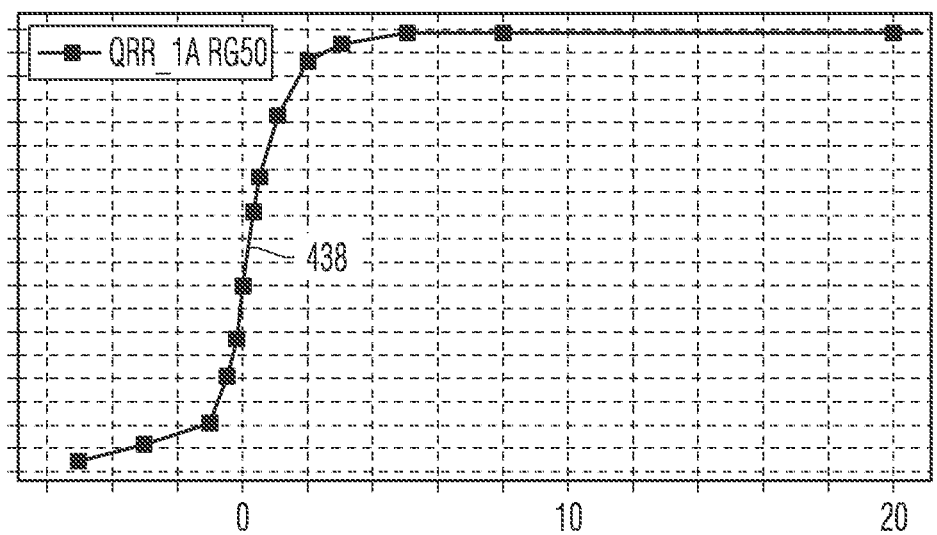
FIG. 5D is a schematic diagram illustrating the impact of the thickness of a base substrate on the reverse recovery charge for discussing effects of the embodiments.

FIG. 5D summarizes the impact of the thickness of the base substrate on the reverse recovery charge. In the diode operation mode of the semiconductor device the electron hole plasma plots the drift zone down to the base substrate. Within the doped base substrate, the plasma concentration decreases and is pinned to "a zero concentration" at a distance to the interface between the base substrate and the epitaxial layer in the range of some μm. Thinning of the semiconductor device into this range, cross which plasma concentration usually decreases within the base substrate 105, decreases the plasma concentration at the interface between the base substrate and the epitaxial layer cause holes start to reach the metal drain electrode, where the recombine such that emitter efficiency is reduced and plasma concentration in the whole device is reduced. If the base substrate is completely removed, the charge carrier plasma density is pinned to zero within the epitaxial layer.

FIGS. 6A to 9B apply the above described method to power semiconductor devices such as n-channel IGFETs 505, for example MOSFETs (metal oxide semiconductor field effect transistors) of the enhancement type with n-type source regions, n-type drain structures and p-type body regions. Similar considerations apply to p-FETs with p-type source regions, p-type drain structure and n-type body region. The IGFETs 505 may have a nominal drain current $I_D$ greater 1A, e.g., greater 10A or greater 100A.

Figure 6A:
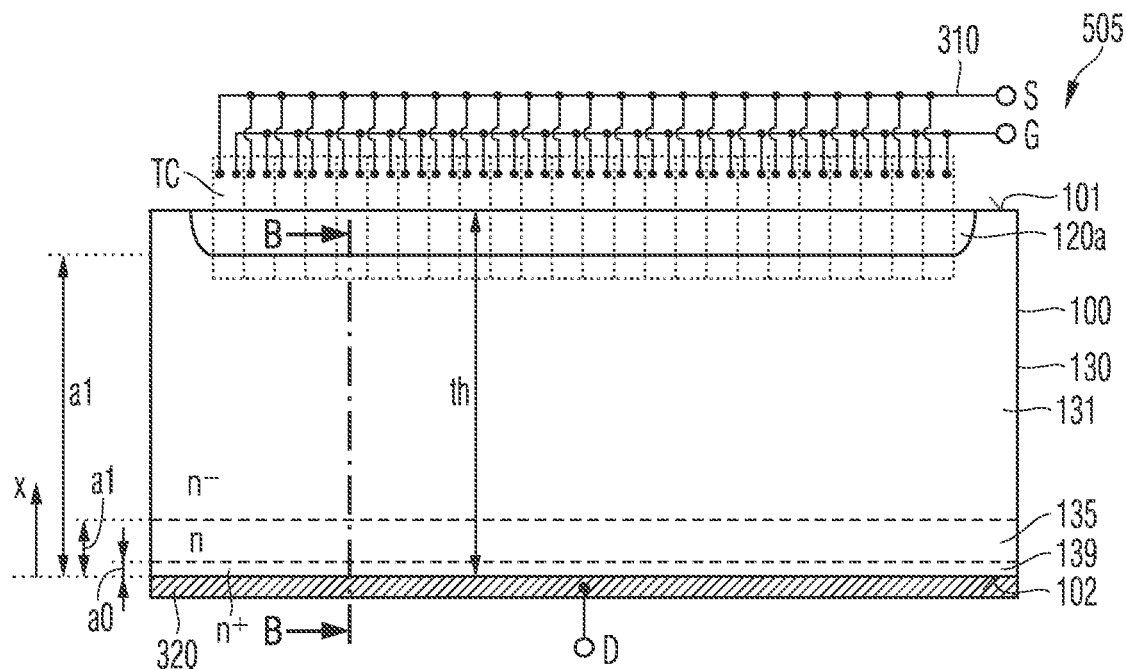
FIG. 6A is a schematic vertical cross-sectional view of a power field effect transistor with a lightly doped drift zone according to an embodiment concerning a completely removed base substrate.
Figure 6B:
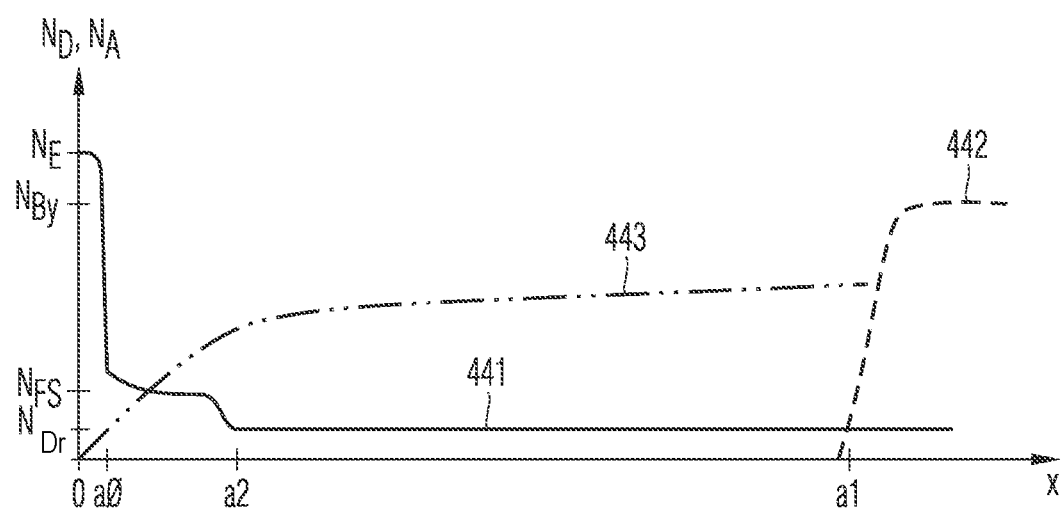
FIG. 6B is a schematic diagram illustrating a vertical dopant distribution along line B-B of FIG. 6A.

In FIGS. 6A and 6B, the power semiconductor device is an IGFET 505 without superjunction structure, wherein during manufacturing a thinning process such as wafer splitting or wafer grinding has completely removed the base substrate.

A crystalline semiconductor material, e.g., silicon (Si), germanium (Ge), silicon germanium (Site) or an $A_{III}B_V$ semiconductor material forms a semiconductor portion 100 with a planar first surface 101 at a front side and a planar second surface 102 on the back of the semiconductor portion 100. A minimum distance between the first and second surfaces 101, 102 defines a thickness 'th' and is related to the voltage blocking capability the semiconductor device 500 is specified for. For example, the die thickness th may be in a range from 40 μm to 60 μm, in case the IGFET 505 is specified for a blocking voltage of about 500 V. Other IGFETs with higher blocking capability may be based on semiconductor portions 100 with a die thickness th of several 100 μm.

In a plane parallel to the first surface 101, the semiconductor portion 100 may have a rectangular shape with an edge length in the range of several millimeters or a circular shape with a diameter of several centimeters. Directions parallel to the first surface 101 are horizontal directions and directions perpendicular to the first surface 101 are vertical directions.

The IGFET 505 includes transistor cells TC formed at the front side of the semiconductor portion 100. Each transistor cell TC includes an n-type source region and a body region formed as a portion of a body well 120a that extends from the first surface 101 into the semiconductor portion 100. The body well 120a forms first pn junctions pn1 with a drain structure 130 between the transistor cells TC and the second surface 102. The body regions separate the source regions of the transistor cells TC from the drain structure 130. Source regions and body regions of the transistor cells TC form second pn junctions and are both connected to a metal source electrode 310. The source electrode 310 may form or may be electrically connected to a source terminal S.

Gate electrodes of the transistor cells TC may be electrically connected or coupled to a gate terminal G and are capacitively coupled to the body regions in the body well 120a through gate dielectrics. Subject to a voltage applied to the gate terminal G, inversion channels are formed in the body regions and allow an electron flow through the transistor cells TC such that in an on-state of the IGFET 505 electrons enter the drain structure 130 through the transistor cells TC.

The transistor cells TC may be planar cells with lateral gate structures arranged outside of the contour of the semiconductor portion 100 or trench cells with trench gate structures extending from the first surface 101 into the semiconductor portion 100, wherein the source and body regions of the transistor cells TC may be formed in mesa portions of the semiconductor portion 100 between the trench gate structures.

The drain structure 130 includes a heavily doped emitter layer 139 directly adjoining the second surface 102. The emitter layer 139 forms a low-ohmic interface with a metal drain electrode 320 formed along the second surface 102. For example, formation of the metal drain electrode 320 may include partly amorphizing the portion of the silicon crystal along the second surface 102 and depositing aluminum, wherein silicon atoms diffuse to some degree into the deposited aluminum layer and aluminum atoms fill resulting gaps in the semiconductor crystal, which result from out-diffusion of silicon, to form protrusions or spikes extending outer several 100 nanometers or several micrometers into the semiconductor portion 100. The drain structure 130 may further include a lightly doped drift zone 131 of a uniform conductivity type. An effective dopant concentration in the drift zone 131 may be at least $1E12$ $cm^{-3}$ and at most $1E17$ $cm^{-3}$.

The doping in the drift zone 131 may correspond to an initial background doping of an epitaxial layer, from which the semiconductor portion 100 is formed. A field stop layer 135 may be sandwiched between the emitter layer 139 and the drift zone 131. A mean dopant concentration in the field stop layer 135 is at least 5 times a mean dopant concentration in the drift zone 131 and at most a half of the maximum dopant concentration in the emitter layer 139. The dopant concentration in the field stop layer 135 may steadily decrease with increasing distance from the second surface 102 or may be uniform. According to other embodiments, the mean dopant concentration in the field stop layer 135 decreases in steps with increasing distance to the second surface 102.

A thickness of the emitter layer 139 may be less than 10 μm. A thickness a2–a0 of the field stop layer 135 may be in the range from 5 μm to 20 μm, for example between 8 μm and 15 μm. An integrated activated donor concentration $N_D$ between x=0 and x=a1 is less than $1.5E13$ $cm^{-2}$, e.g., at most $8E12$ $cm^{-2}$.

FIG. 6B shows donor distribution 441 and acceptor distribution 442 along a line perpendicular to the first surface 101. A hole distribution 443 is pinned to 0 at the interface to the drain electrode 320, such that the reverse recovery charge $Q_{rr}$ is small. At the same time the active implant dose is sufficiently high to form a robust emitter, which has sufficient irradiation ruggedness.

Figure 7A:
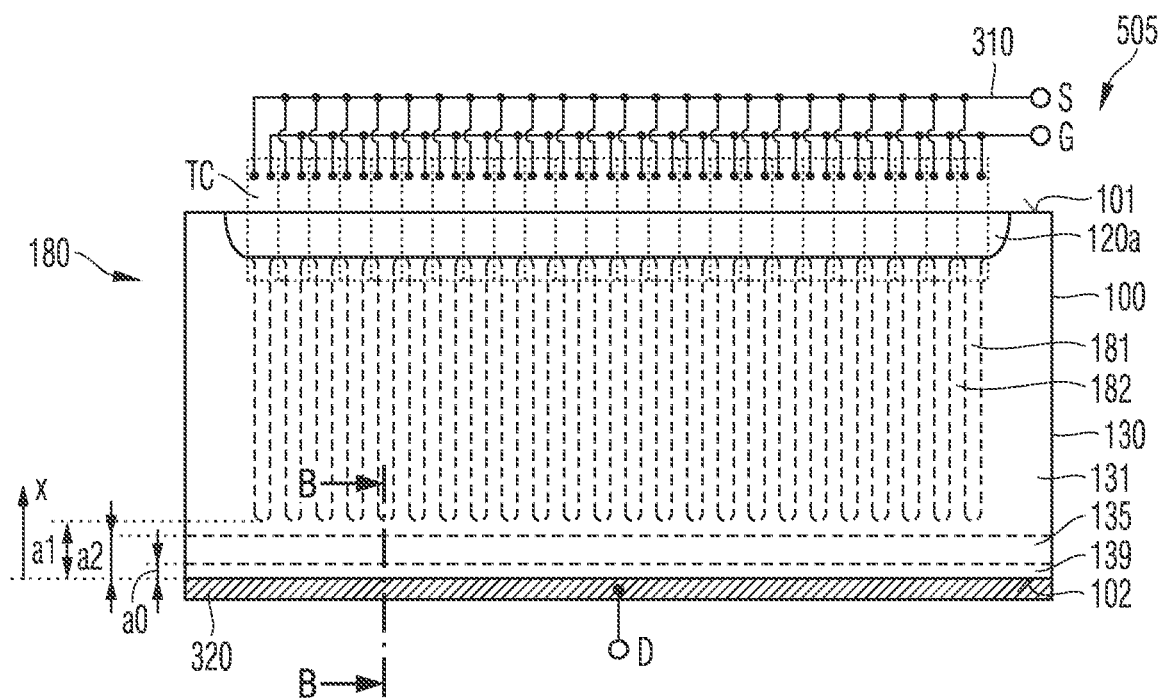
Figure 7B:
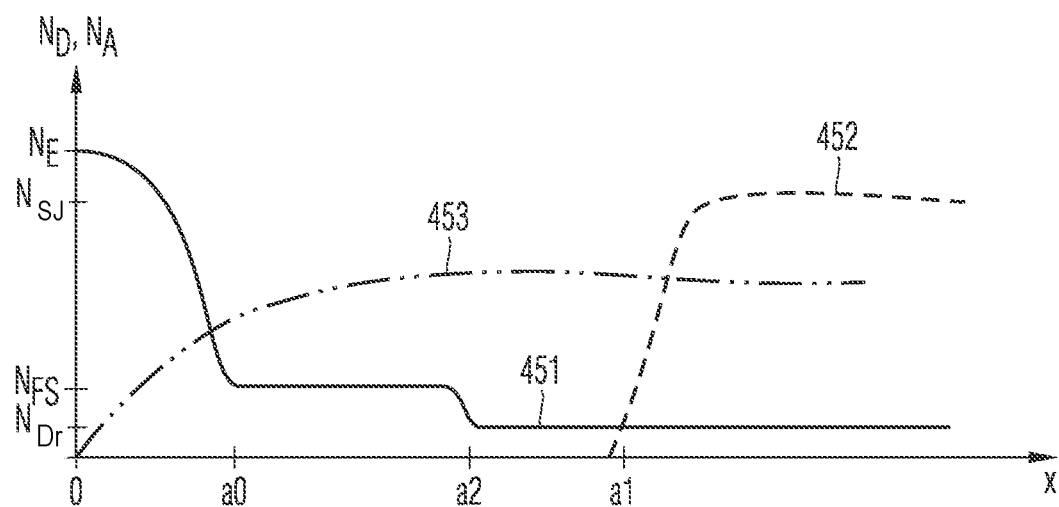
FIG. 7B is a schematic diagram illustrating a vertical dopant distribution along line B-B of FIG. 7A.

The IGFET 505 of FIGS. 7A to 7B further includes a superjunction structure 180 including first regions 181 of the conductivity type of the source regions and the emitter layer 139 as well as second regions 182 of the complementary conductivity type. A mean dopant concentration in the superjunction structure is between $1E15$ $cm^{-3}$ to $1E18$ $cm^{-3}$. An integrated concentration of activated donors between the drain electrode 320 and the second regions 182 is at most $1.5E13$ $cm^{-2}$, for example at most to $8E12$ $cm^{-2}$.

FIG. 7B shows the donor distribution 451, the acceptor distribution 452 as well as the hole distribution 453 in case the body diode is forward biased.

Figure 8A:
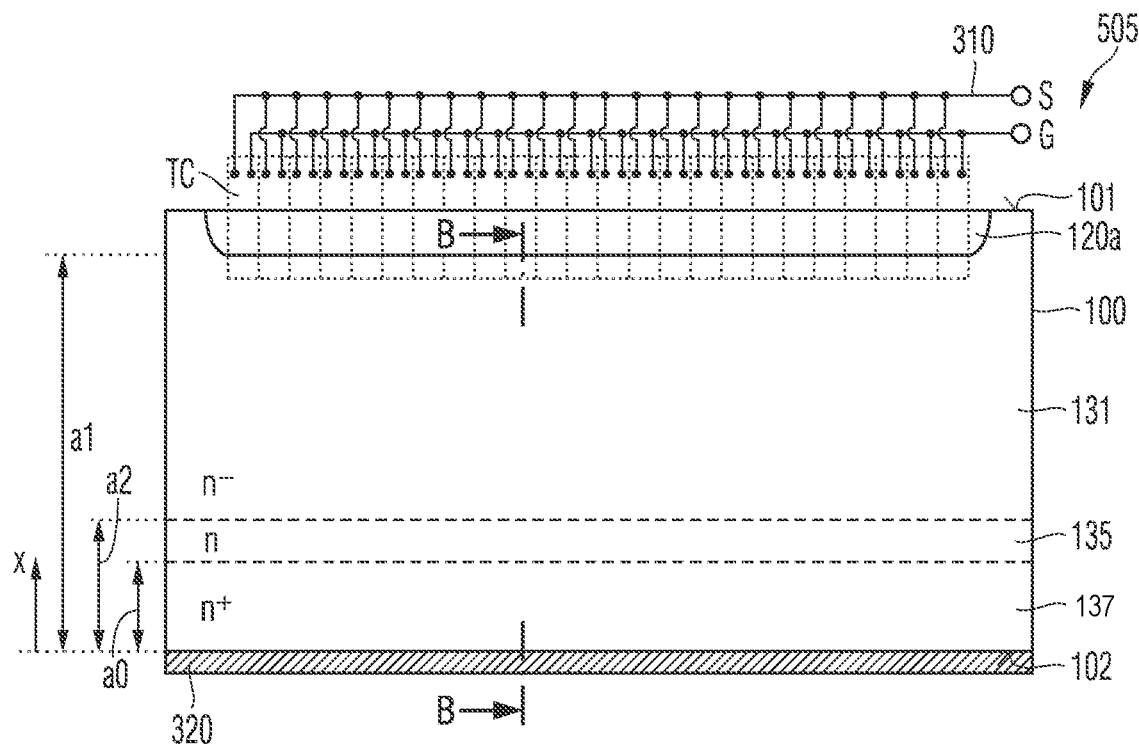
FIG. 8A is a schematic vertical cross-sectional view of a power field effect transistor with a lightly doped drift zone according to an embodiment concerning a remnant base section.
Figure 8B:
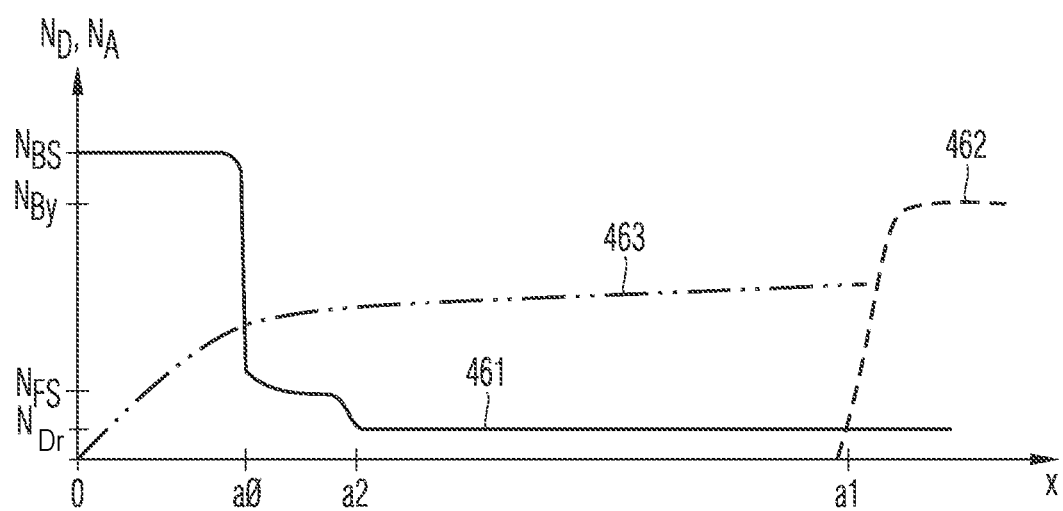
FIG. 8B is a schematic diagram illustrating a vertical dopant distribution along line B-B of FIG. 8A.

The IGFET 505 of FIGS. 8A to 8B differs from the one in FIGS. 6A to 6B in that a remnant section of a heavily-doped base substrate forms a drain contact structure 137 sandwiched between the drift zone 131 and the drain electrode 320, or in presence of a field stop layer 135, between the field stop layer 135 and the metal drain electrode 320. A thickness a0 of the drain contact structure 137 may be at most 10 μm, for example at most 5 μm. A mean dopant concentration in the drain contact structure 137 is at least $1E19$ $cm^{-3}$ and sufficiently high to form an ohmic contact with the metal of the metal drain electrode 320.

FIG. 8B shows that the donor distribution 461 is approximately uniform in the drain contact structure 137 between x=0 and x=a0. The hole distribution 463 in case of the forward-biased body diode is pinned to zero between x=0 and x=a0, wherein a0 is smaller than a distance where the hole distribution 463 would be pinned to zero in case of a thicker drain contact structure 137.

Figure 9A:
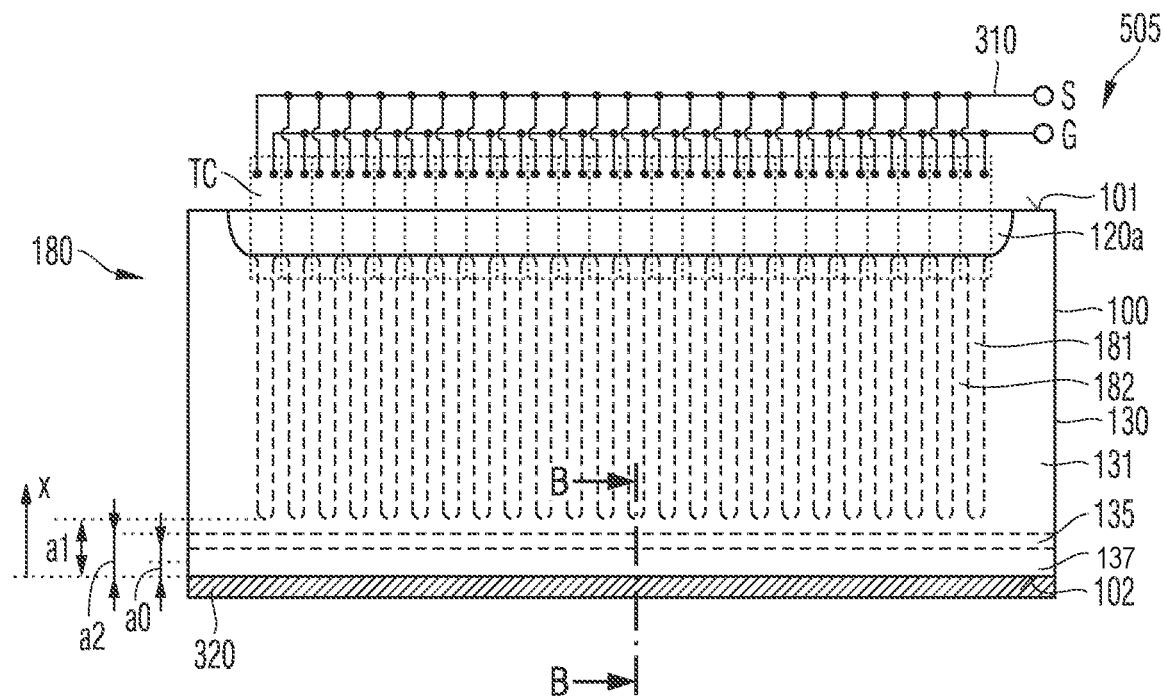
FIG. 9A is a schematic vertical cross-sectional view of a power field effect transistor with super junction structure according to an embodiment concerning a remnant base section.
Figure 9B:
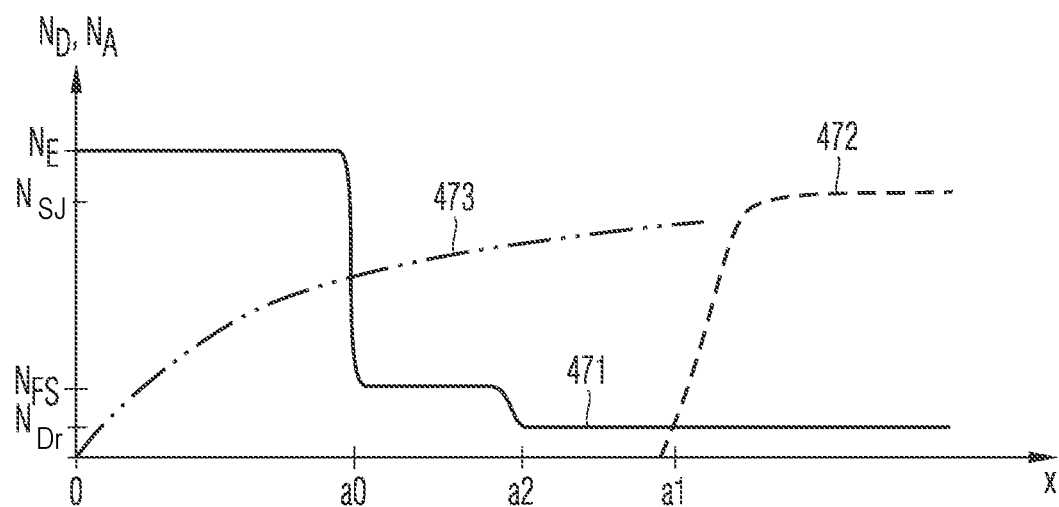
FIG. 9B is a schematic diagram illustrating a vertical dopant distribution along line B-B of FIG. 9A.

FIGS. 9A to 9B refer to an IGFET 505 including a superjunction structure 180, wherein a remnant base section 105a of a base substrate forms the drain contact structure 137.

According to FIG. 9B the donor distribution 471 is approximately uniform in the drain contact structure 137 between x=0 and x=a0. The hole distribution 473 in case of the forward-biased body diode is pinned to zero between x=0 and x=a0, wherein a0 is smaller than a distance where the hole distribution 473 would be pinned to zero in case of a thicker drain contact structure 137.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   transistor cells formed along a first surface at a front side of a semiconductor body and comprising body regions of a first conductivity type;
   a drift region of a second conductivity type that is opposite from the first conductivity type and is disposed between the body regions and a second surface of the semiconductor body that is opposite from the first surface; and
   an emitter layer of the second conductivity type that is disposed between the drift region and the second surface of the semiconductor body, the emitter layer having a higher dopant concentration than the drift region;
   a metal drain electrode directly adjoining the emitter layer,
   wherein the metal drain electrode comprises pointed spikes extending into the emitter layer.

2. A semiconductor device, comprising:
   transistor cells formed along a first surface at a front side of a semiconductor body and comprising body regions of a first conductivity type;
   a drift region of a second conductivity type that is opposite from the first conductivity type and is disposed between the body regions and a second surface of the semiconductor body that is opposite from the first surface; and
   an emitter layer of the second conductivity type that is disposed between the drift region and the second surface of the semiconductor body, the emitter layer having a higher dopant concentration than the drift region;
   a metal drain electrode directly adjoining the emitter layer,
   wherein the metal drain electrode comprises pointed spikes extending into the emitter layer,
   wherein an integrated concentration of activated dopants along a shortest line between the metal drain electrode and a closest doped region of the first conductivity type is at most $1\ E13$ $cm^{-2}$.

3. The semiconductor device of claim 2, wherein the shortest line extends through the emitter layer and the drift region.

4. The semiconductor device of claim 2, further comprising:
   a superjunction structure comprising first regions which have the second conductivity type and second regions which have the first conductivity type, the first and the second regions of the superjunction structure alternating along a horizontal direction parallel to the first surface in the drift region, wherein the closest doped region of the first conductivity type is the second regions of the superjunction structure.

5. The semiconductor device of claim 1, wherein along an interface between the metal drain electrode and the emitter layer, an activated dopant concentration of the emitter layer allows carrier tunneling of electrons and holes between the metal drain electrode and the emitter layer.

6. The semiconductor device of claim 1, wherein at least two of the pointed spikes have a different height.

7. The semiconductor device of claim 1, wherein a maximum vertical extension of the pointed spikes is greater than 1 µm.

8. A semiconductor device, comprising:
   transistor cells formed along a first surface at a front side of a semiconductor body and comprising body regions of a first conductivity type;
   a drift region of a second conductivity type that is opposite from the first conductivity type and is disposed between the body regions and a second surface of the semiconductor body that is opposite from the first surface; and
   an emitter layer of the second conductivity type that is disposed between the drift region and the second surface of the semiconductor body, the emitter layer having a higher dopant concentration than the drift region;
   a metal drain electrode directly adjoining the emitter layer,
   wherein the metal drain electrode comprises pointed spikes extending into the emitter layer,
   further comprising:
   a field stop layer of the first conductivity type that is disposed between the drift region and the emitter layer,
   wherein the field stop layer has a higher dopant concentration than the drift region and a lower dopant concentration than the emitter layer.

9. The semiconductor device of claim 1, wherein a thickness of the emitter layer is at most 10 µm.

10. The semiconductor device of claim 8, wherein a thickness of the field stop layer is between 5 µm and 20 µm.

11. The semiconductor device of claim 1, wherein a mean dopant concentration in the emitter layer is at least 1E19 cm−3.

12. The semiconductor device of claim 1, wherein the transistor cells are IGFET (insulated gate field effect transistor) cells.

13. The semiconductor device of claim 1, wherein the pointed spikes include a metal alloy containing silicon.

14. The semiconductor device of claim 1, wherein an integrated activated donor concentration along a shortest line connecting the pointed spikes and a closest doped region of the first conductivity type is at most 1 E13 $cm^{-2}$.

15. The semiconductor device of claim 2, wherein at least two of the pointed spikes have a different height.

16. The semiconductor device of claim 2, wherein maximum vertical extension of the spikes is greater than 1 µm.

17. The semiconductor device of claim 8, wherein at least two of the pointed spikes have a different height.

18. The semiconductor device of claim 8, wherein the pointed spikes include a metal alloy containing silicon.

19. The semiconductor device of claim 8, wherein maximum vertical extension of the spikes is greater than 1 µm.

20. The semiconductor device of claim 8, wherein an integrated activated donor concentration along a shortest line connecting the pointed spikes and a closest doped region of the first conductivity type is at most 1 E13 $cm^{-2}$.

* * * * *